United States Patent [19]

Miettunen

[11] Patent Number: 5,325,027
[45] Date of Patent: Jun. 28, 1994

[54] METHOD AND APPARATUS FOR MEASURING THE DEGREE OF FULLNESS OF A MILL WITH LIFTING BEAMS BY MONITORING VARIATION IN POWER CONSUMPTION

[75] Inventor: Jorma K. Miettunen, Pyhäsalmi, Finland

[73] Assignee: Outokumpu Mintec OY, Espoo, Finland

[21] Appl. No.: 926,975

[22] Filed: Aug. 7, 1992

Related U.S. Application Data

[63] Continuation-in-part of Ser. No. 821,471, Jan. 14, 1992, abandoned.

[30] Foreign Application Priority Data

Jan. 15, 1991 [FI] Finland .................................. 910202

[51] Int. Cl.⁵ .............................................. H02P 7/00
[52] U.S. Cl. .................................................... 312/482
[58] Field of Search ................ 318/39, 482, 434, 486; 364/474.06, 474.09, 474.12, 474.15; 324/158, 306, 314; 241/33–36, 101.3; 73/861.36, 291; 417/18, 26, 211.5, 280

[56] References Cited

U.S. PATENT DOCUMENTS

| | | | |
|---|---|---|---|
| 1,871,499 | 4/1932 | Crago | 318/39 |
| 2,654,860 | 10/1953 | Lewis | 324/119 |
| 3,611,339 | 10/1971 | Richey | 324/122 |
| 3,729,667 | 4/1973 | Taylor | 318/482 |
| 3,904,857 | 9/1975 | Sandblom | 318/39 X |
| 4,123,009 | 10/1978 | Kilpinen | 324/158 MG |
| 4,210,290 | 7/1980 | Andersson et al. | 241/30 |
| 4,382,308 | 5/1983 | Carcio | 318/39 X |
| 4,406,605 | 9/1983 | Hand | 364/474.12 X |
| 4,478,371 | 10/1984 | Williams | 241/30 |
| 4,890,058 | 12/1989 | Trenkler et al. | 324/158 MG |
| 4,942,351 | 7/1990 | Kronau | 318/482 X |
| 4,965,513 | 10/1990 | Haynes et al. | 73/659 |
| 4,978,909 | 12/1990 | Hendrix et al. | 324/158 MG |
| 5,010,286 | 4/1991 | Nakamura et al. | 364/474.15 X |
| 5,059,879 | 10/1991 | Watanabe | 318/434 |

FOREIGN PATENT DOCUMENTS 1135364 11/1982 Canada .

*Primary Examiner*—Jonathan Wysocki
*Attorney, Agent, or Firm*—Smith-Hill and Bedell

[57] ABSTRACT

The degree of fullness of a rotary mill is determined by measuring the variation in power consumption of the elector motor due to the lifting beams of the mill casing striking material in the mill during rotation of the mill casing.

3 Claims, 2 Drawing Sheets

METHOD AND APPARATUS FOR MEASURING THE DEGREE OF FULLNESS OF A MILL WITH LIFTING BEAMS BY MONITORING VARIATION IN POWER CONSUMPTION

CROSS-REFERENCE TO RELATED APPLICATION

This application is filed as a continuation-in-part of co-pending application Ser. No. 07/821,471 filed Jan. 14, 1992 now abandoned.

BACKGROUND OF THE INVENTION

The present invention relates to a method and apparatus for measuring the degree of fullness of an electrically driven mill, which method and apparatus make use of power variations affecting the electric motor of the mill.

In accordance with the disclosure in Canadian Patent 1,135,346, the power consumed by a mill driven by an electric motor, particularly an autogenous mill, varies periodically, and the amplitude of the periodic variation depends on the degree of fullness of the mill. Accordingly, the Canadian patent discloses a method and apparatus for measuring the degree of fullness of such a mill by continuously generating an electric signal representing the variation in electric power consumed by the mill within a relatively low frequency range 2-25 Hz. The degree of fullness of the mill is determined on the basis of the power signal, by utilizing test measurements performed earlier with different degrees of fullness.

SUMMARY OF THE INVENTION

It has been observed that the variation in power consumption of the electric motor of the mill is composed of a succession of power peaks that occur at a constant frequency. The peaks in the power consumption of the mill's electric motor are created when the lifting beams of the mill casing strike the mass being milled. Therefore, the time at which a peak is formed, relative to the time at which the mill was at a given angular position, is earlier when the degree of fullness in the mill is greater. Thus the method of measurement is based on an exact determination of the moment of striking. The moment of striking is determined by measuring the occurrence of the peak in the mill's power consumption in relation to time during a revolution of the mill, starting when the mill is at a predetermined angular position. A position sensor is used for timing the power measurement. The position sensor generates a pulse each time a reference marker on the circumference of the mill passes the position sensor.

When applying the method of the invention, the measuring apparatus first generates a calibration curve. During an interval that covers a predetermined number of revolutions of the mill, a signal representative of the power consumed by the motor is sampled at a selected sampling frequency to provide a sequence of power values. The pulse generated by the position sensor is used to divide the sequence of power values into multiple segments, each of which covers one revolution and starts with the mill at the same angular position. On the basis of these segments, there is then formed an average power curve, which is a calibration curve of the mill and is stored in the measuring processor. The degree of fullness of the mill that corresponds to the calibration curve is defined in a known fashion.

After forming the calibration curve for the mill, a measurement curve for an unknown degree of fullness is formed in an essentially continuous fashion. In forming the measurement curve, the power consumed by the mill's electric motor is measured over the same number of revolutions of the mill and at the same sampling frequency, so that an equal number of sample values is obtained as was the case with the calibration curve. The measured power values are combined into a measurement curve, which represents the average variation in power over the revolutions covered by the measurement and is also stored in the memory of the measuring processor.

The measurement curve and the calibration curve are compared to each other in order to determine the amount by which the measurement curve must be shifted in order to match the calibration curve. This determination is carried out by first subtracting from each curve the average power over the interval covered by the curve, so that the offset curve has a zero d.c. component, whereafter the offset measurement curve is shifted on the time axis to the position such that it optimally overlaps the offset calibration curve. The most advantageous matching is determined by using the least sum of squares method. From the shift corresponding to the least sum of squares, the unknown degree of fullness is calculated on the basis of the known degree of fullness and revolution period of the mill.

In the apparatus of the invention, the measuring processor is a microprocessor which can, when necessary, be simultaneously provided with power signals generated by several electrically driven mills.

Advantageously the measuring processor is implemented on a processor card and may be based on the Intel 8052 processor. The processor card is connected to the power input of the mill and to the position sensor, and can be connected to a process control computer. Advantageously the processor card carries components to provide all necessary interfaces and functions required in the measurement of the degree of fullness. However, such components may alternatively be provided on a separate input/output card. When the processor card is connected to a process control computer, the information on the degree of fullness is advantageously transmitted from the processor card to the process control computer as current pulses.

The method of measuring the degree of fullness of a mill can advantageously be applied for instance to autogenous mills, semiautogenous mills and ball mills. At least with these mills, the lifting beams of the mill cause such a significant variation in the power consumed by the electric motor that the power signal contains characteristic features that make it possible to determine the degree of fullness of the mill from the shift of the mill's power curve.

The measuring apparatus of the invention can be employed in adjusting and optimizing the degree of fullness of the mill. In response to measurement of the degree of fullness, the feeding of the mill is advantageously controlled. Also, by analyzing the power curves stored in the measuring processor with different linings of the same mill, it is possible to optimize for example the number and size of the lifting beams used in the mill.

BRIEF DESCRIPTION OF THE DRAWING

The invention is described below with reference to the appended drawings, in which.

DETAILED DESCRIPTION

Figure 1:
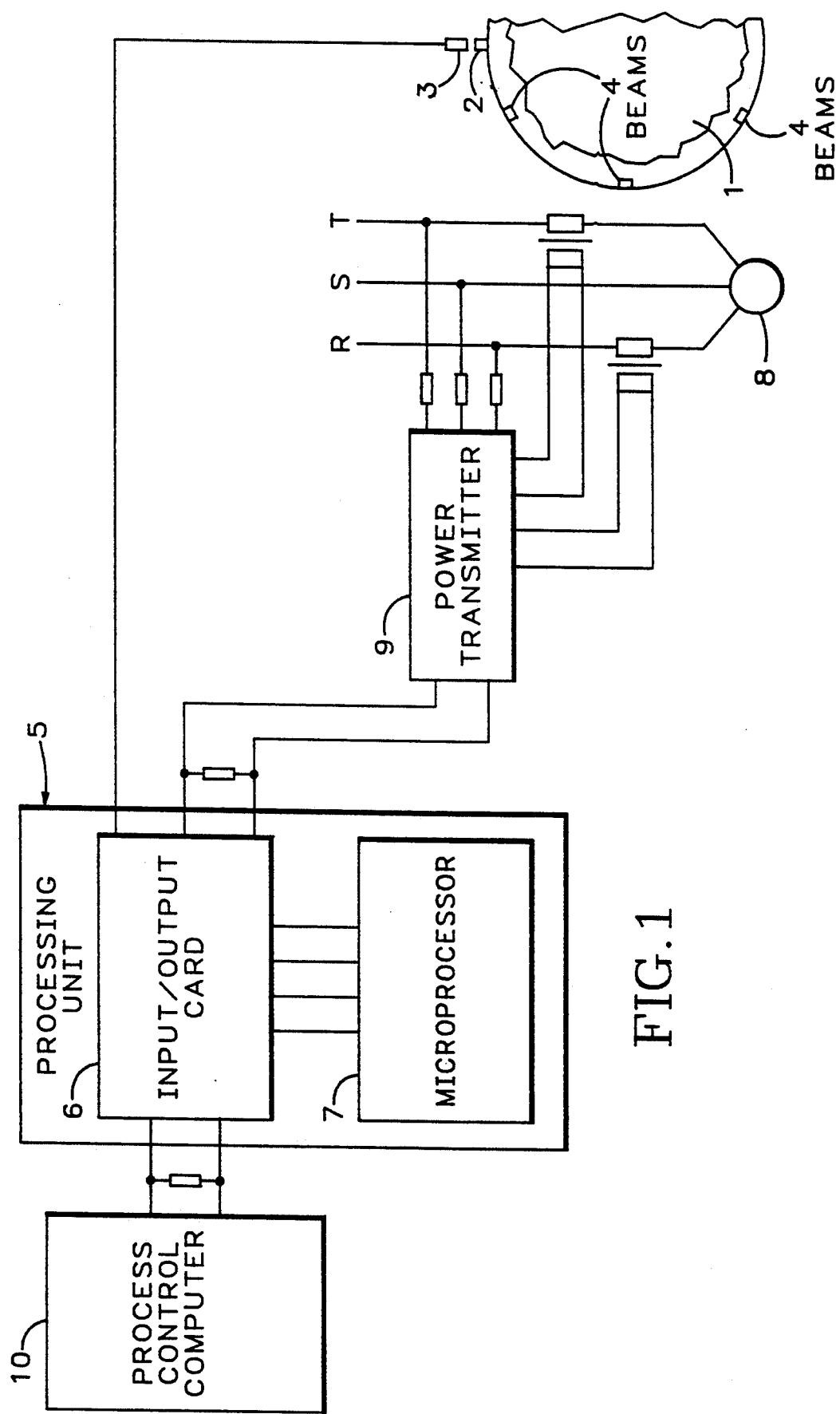
FIG. 1 is a schematic illustration of a preferred embodiment of the invention.

FIG. 1 of the drawings illustrates a mill 1 having lifting beams 4. The mill is driven by a three-phase electric motor 8 that receives current by way of conductors R, S and T. During operation of the mill, the mill casing is rotated by the motor 8 at a constant angular speed, and the power consumption of the motor fluctuates. Peaks in the power consumption occur when a lifting beam strikes the mass of material in the mill. Consequently, the position of the peak due to a particular lifting beam striking the mass depends on the degree of fullness of the mill.

A power transmitter 9 senses the power consumed by the electric motor and provides an analog power signal representative of the power consumption to processing unit 5, which includes a microprocessor 7 and an input/output card 6. The processing unit includes an analog to digital converter, which samples the analog power signal provided by the power transmitter at a selected sampling rate, and therefore provides the microprocessor with a sequence of digital values representing variation in power consumption as a function of time.

A metal reference marker 2 is fastened to the casing of the mill 1, and a measuring sensor 3 mounted at the exterior of the mill provides a pulse to the processing unit 5 each time the reference marker 2 passes the sensor 3 during rotation of the mill. The pulse allows the processing unit to divide the sequence of digital values into multiple segments each representing variation in power consumption during one revolution of the mill, each containing the same number of samples and each starting with the mill at the same angular position.

It is necessary to calibrate the measurement apparatus with reference to a known degree of fullness. The mill is operated with a known degree of fullness and calibration data is acquired over a selected number of revolutions of the mill. By reference to the pulse provided by the sensor 3, the calibration data is divided into multiple segments, and the segments are averaged to form a power curve representing the variation in power consumption of the mill over a single revolution. Further, the average power consumption over a single revolution is subtracted from the power curve so as to offset the curve so that its DC component is substantially zero. This calibration curve is stored in the memory of the processing unit.

During operation of the mill at an unknown degree of fullness, power consumption data is acquired over an equal number of revolutions, and the power consumption data is processed in the same manner as described above, providing a measurement curve that is also stored. The processing unit compares the measurement curve and the calibration curve. If the measurement curve is generated at a higher degree of fullness, the peaks and zero crossings of the measurement curve occur earlier than the corresponding features of the calibration curve. The microprocessor determines what shift of the measurement curve leads to optimum matching of the two curves. Advantageously, the matching of the two curves is tested by computing the sum of the squares of the difference between the measurement curve and the calibration curve and determining the shift that provides a minimum value for this quantity. The degree of fullness of the mill can be calculated from the shift, the degree of fullness for the calibration curve, and the period of revolution of the mill. The calculated value of the degree of fullness of the mill may be transmitted from the processing unit 5 to a process control computer 10.

Figure 2:
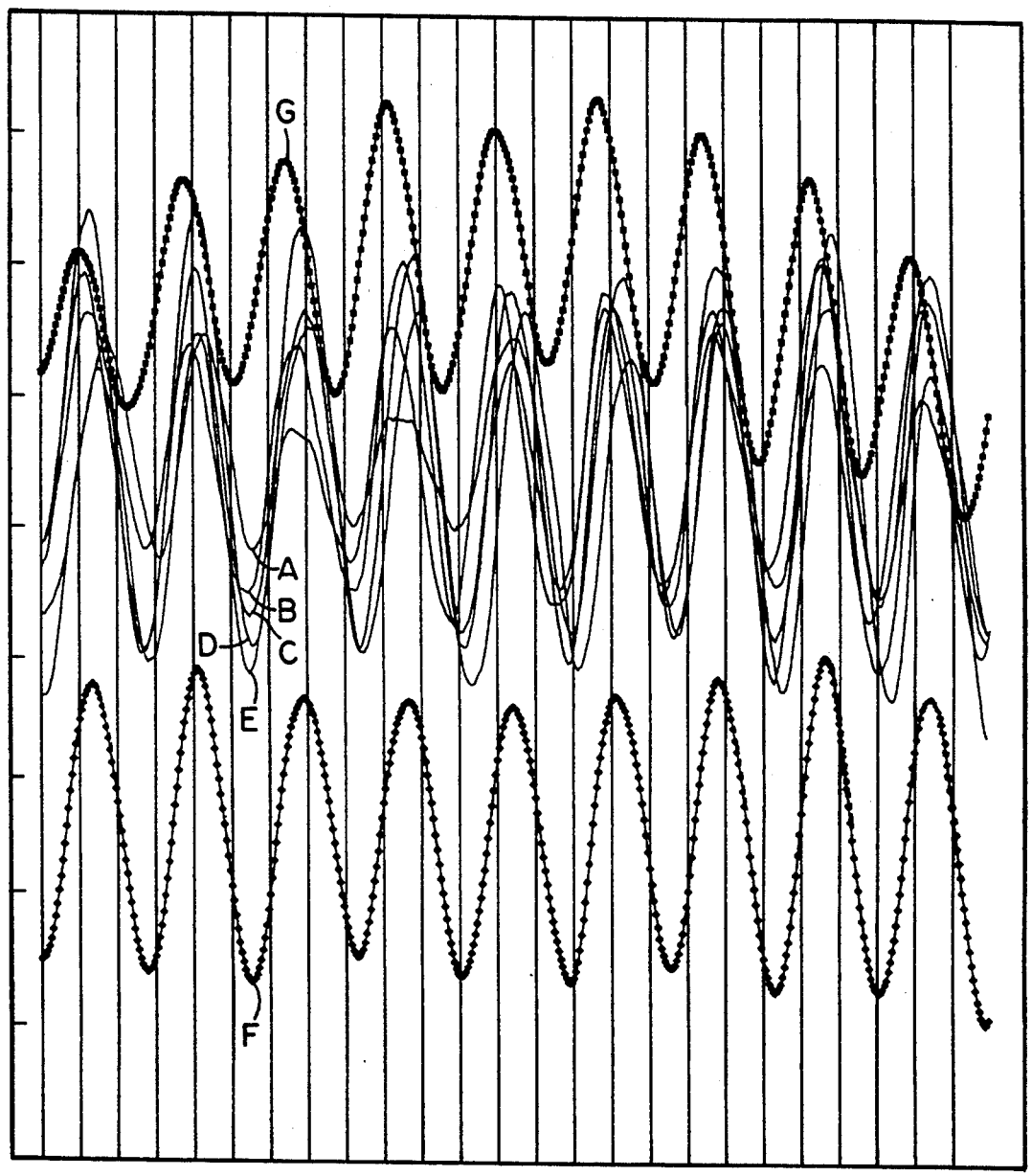
FIG. 2 is a graph illustrating operation of the invention.

The curves A-E shown in FIG. 2 represent variation in power consumed by the electric motor over five revolutions of the mill at a constant degree of fullness. The curve F is the average of the five curves A-E, offset vertically from the curves A-E for clarity. The curve G is a calibration curve representing variation in power consumption of the electric motor when the mill has a known degree of fullness.

It will be appreciated that the invention is not restricted to the particular embodiment that has been described, and that variations may be made therein without departing from the scope of the invention as defined in the appended claims and equivalents thereof.

I claim:

1. A method for measuring the degree of fullness of a rotary mill that has a mill casing with lifting beams at its interior and is driven by an electric motor, said method comprising measuring the variation in power consumed by the electric motor due to the lifting beams striking a mass of material in the mill when the mill has a known degree of fullness, to form a calibration curve, and measuring the variation in power consumed by the electric motor due to the lifting beams striking a mass of material in the mill when the mill has an unknown degree of fullness, so as to form a measurement curve, and comparing the measurement curve and the calibration curve, wherein the measurement curve and the calibration curve each represent power consumption during a single revolution of the mill and each start when the mill is at the same angular position, and the step of comparing the measurement curve and the calibration curve comprises selectively shifting the measurement curve relative to the calibration curve along a time axis and determining the shift for which the measurement curve and the calibration curve are most closely matched in shape.

2. A method according to claim 1, comprising measuring the variation in power consumed by the electric motor over a plurality of revolutions of the mill, and dividing the resulting sequence into multiple segments, each representing power consumption as a function of time during a single revolution of the mill and each starting when the mill is at the same angular position.

3. A method according to claim 1, wherein the step of determining the shift at which the curves are most closely matched in shape comprises calculating the sum of the squares of the difference between the measurement curve and the calibration curve and determining the shift for which the sum of the squares has a minimum value.

* * * * *